United States Patent
Chen et al.

(10) Patent No.: US 7,670,438 B2
(45) Date of Patent: Mar. 2, 2010

(54) METHOD OF REMOVING PARTICLES FROM WAFER

(75) Inventors: Yi-Wei Chen, Taichung County (TW); Bao-Tzeng Huang, Pingtung County (TW); An-Chi Liu, Tainan (TW); Chao-Ching Hsieh, Hsinchu County (TW); Nien-Ting Ho, Tainan (TW); Kuo-Chih Lai, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 133 days.

(21) Appl. No.: 11/866,746

(22) Filed: Oct. 3, 2007

(65) Prior Publication Data

US 2009/0090395 A1 Apr. 9, 2009

(51) Int. Cl.
*B08B 3/04* (2006.01)
(52) U.S. Cl. .............................. 134/2; 134/1; 134/25.4; 134/25.5; 134/26; 134/32; 134/33; 134/34; 134/36; 134/42; 510/175
(58) Field of Classification Search ................. 134/1–2, 134/25.4, 25.5, 26, 32, 33–34, 36, 42; 510/175
See application file for complete search history.

(56) References Cited

U.S. PATENT DOCUMENTS 6,159,662 A * 12/2000 Chen et al. ............... 430/313
6,222,936 B1 * 4/2001 Phan et al. ............... 382/149
6,432,622 B1 * 8/2002 Moon et al. ............... 430/331
6,494,985 B1 * 12/2002 Sotozaki et al. ......... 156/345.12
2002/0197853 A1 * 12/2002 Nagai et al. ............... 438/639
2005/0142880 A1 6/2005 Park
2006/0000190 A1 1/2006 Behnke et al.
2006/0223336 A1 * 10/2006 Wei ............................ 438/782
2007/0113872 A1 * 5/2007 Uchida et al. ................. 134/26
2008/0069948 A1 * 3/2008 Yoshihara et al. ........... 427/240

FOREIGN PATENT DOCUMENTS

JP 408195370 A * 7/1996

* cited by examiner

*Primary Examiner*—Sharidan Carrillo
(74) *Attorney, Agent, or Firm*—J.C. Patents

(57) ABSTRACT

A method of removing particles from a wafer is provided. The method is adopted after a process for removing unreactive metal of a salicide process or after a salicide process and having oxide residue remaining on a wafer or after a chemical vapor deposition (CVD) process that resulted with particles on a wafer. The method includes performing at least two cycles (stages) of intermediate rinse process. Each cycle of the intermediate rinse process includes conducting a procedure of rotating the wafer at a high speed first, and then conducting a procedure of rotating the wafer at a low speed.

20 Claims, 2 Drawing Sheets

METHOD OF REMOVING PARTICLES FROM WAFER

BACKGROUND OF THE INVENTION

1. Field of Invention

The present invention relates to a fabrication method of a semiconductor device; more particularly, the present invention is related to a method of removing particles from a wafer.

2. Description of Related Art

During the fabrication of a semiconductor device, various types of particles are precipitated on the surface of the wafer. The particles precipitated on the wafer surface may hinder the operation of the device to adversely affect the yield. Hence, to effectively remove particles precipitated on a wafer surface is a serious issue to be considered. For example, in a 65 nm process and below, to lower the contact resistance, to enhance the thermal stability, and to mitigate problems of leakage current and defects, platinum is normally added to silicon nickel. However, in the current self-aligned silicide process, after removing the unreacted nickel and platinum, many particles remained on the wafer surface. Since the final cleaning process in removing the unreacted nickel and platinum is conducted in a wet station, in which batch spin method is employed by rotating the wafers for a fixed number of times to treat 25 to 50 wafers collectively, the capability to fully remove particles is limited and ineffective. Further, the problems of non-uniformity are often resulted.

SUMMARY OF THE INVENTION

The present invention is to provide a method that can effectively remove particles on a wafer to reduce residual particles and to increase the process yield.

The present invention is to provide a method of removing particles on a wafer, wherein the method is adopted for removing the unreacted metal layer on a wafer in a salicide process. The method includes at least two cycles of intermediate rinse process, wherein each cycle of the intermediate rinse process includes conducting a procedure of rotating the wafer at a high speed (a high-speed wafer-rotation procedure) first, and then conducting a procedure of rotating the wafer at a low speed (a low-speed wafer-rotation procedure).

According to a method of removing particles on a wafer of an embodiment of the present invention, the directions of motor rotation of the high speed wafer-rotation procedure and the low speed wafer-rotation procedure in each cycle of the intermediate rinse process are the same.

According to a method of removing particles on a wafer of an embodiment of the present invention, the directions of motor rotation of two neighboring cycles of the intermediate rinse process are different.

According to a method of removing particles on a wafer of an embodiment of the present invention, the rotational speed of the wafer in the high-speed wafer-rotation procedure is about 100 to about 300 rpm.

According to a method of removing particles on a wafer of an embodiment of the present invention, the rotational speed of the wafer in the low-speed wafer-rotation procedure is about 20 to about 100 rpm.

According to a method of removing particles on a wafer of an embodiment of the present invention, the duration of the high-speed wafer-rotation procedure is about 5 seconds to about 30 seconds.

According to a method of removing particles on a wafer of an embodiment of the present invention, the duration of the low-speed wafer-rotation procedure is about 5 seconds to about 30 seconds.

According to a method of removing particles on a wafer of an embodiment of the present invention, the rotational speed of the wafer in the high-speed wafer-rotation procedure is about 3 to about 10 times of that in the low-speed wafer-rotation procedure.

According to a method of removing particles on a wafer of an embodiment of the present invention, the low-speed wafer-rotation procedure includes a first low-speed wafer-rotation procedure and a second low-speed wafer-rotation procedure, wherein the rotational speed of the wafer in the second low-speed wafer-rotation procedure is lower than the rotational speed of the wafer in the first low-speed wafer-rotation procedure.

According to a method of removing particles on a wafer of an embodiment of the present invention, the rotational speed of the wafer in first low-speed wafer-rotation procedure is about 2 to about 5 times of that in the second low-speed wafer-rotation procedure.

According to a method of removing particles on a wafer of an embodiment of the present invention, an initial-setup wafer-rotation procedure is performed prior to the high-speed wafer-rotation procedure.

According to a method of removing particles on a wafer of an embodiment of the present invention, the rotational speed increases at a rate of 35 rpm to arrive at the rotational speed of the high-speed wafer-rotation procedure.

According to a method of removing particles on a wafer of an embodiment of the present invention, the rotational speed decreases at a rate of 30 rpm to arrive at the rotational speed of the low-speed wafer-rotation procedure.

According to a method of removing particles on a wafer of an embodiment of the present invention, a flushing solvent delivered to at least one cycle of the multi-cycle intermediate rinse process includes deionzied water.

According to a method of removing particles on a wafer of an embodiment of the present invention, in at least one cycle of the multi-cycle intermediate rinse process, hot deionized water is sprayed from a side bowl of a rinse chamber and cold deionized water is sprayed form a center of the rinse chamber.

According to a method of removing particles on a wafer of an embodiment of the present invention, the temperature of the hot deionized water is about 50 to 100 degrees Celsius.

According to a method of removing particles on a wafer of an embodiment of the present invention, the temperature of the hot deionized water is room temperature.

According to a method of removing particles on a wafer of an embodiment of the present invention, a flushing solvent delivered to at least one cycle of the multi-cycle intermediate rinse process includes a chemical agent.

According to a method of removing particles on a wafer of an embodiment of the present invention, ultrasonic vibration is concurrently performed during each cycle of the intermediate rinse process.

According to a method of removing particles on a wafer of an embodiment of the present invention, a final rinse process is performed.

According to a method of removing particles on a wafer of an embodiment of the present invention, deionized water at about 50 to about 100 degrees Celsius is delivered to the final rinse process.

According to a method of removing particles on a wafer of an embodiment of the present invention, at least two cycles of the intermediate rinse process are performed at a wet station.

In accordance to a method of removing particles on a wafer of the present invention, particles remaining on a wafer is effectively removed to reduce residual particles and to enhance the process yield.

In order to make the aforementioned and other objects, features and advantages of the present invention comprehensible, a preferred embodiment accompanied with figures is described in detail below.

DESCRIPTION OF EMBODIMENTS

The particle removal method of the present invention is adopted for removing unreacted metal layer on a wafer in a salicide process or oxide residue from the previous layer subsequent to the growing of the final silicon material. For example, subsequent to forming a nickel-platinum (NiPt) alloy layer and a titanium nitride barrier layer on a wafer, a first annealing process is performed to form a NiPt salicide layer. Thereafter, the titanium nitride layer is removed, followed by removing the unreacted NiPt alloy layer. Prior to or subsequent to performing the second annealing process, a rinse process of the present invention may perform to remove particles on the wafer, for example metal particles or oxide particles, etc., to enhance the yield of the process. Further, this method of the invention in removing particles is also applicable to remove particles on a wafer after a chemical vapor deposition process.

Figure 1:
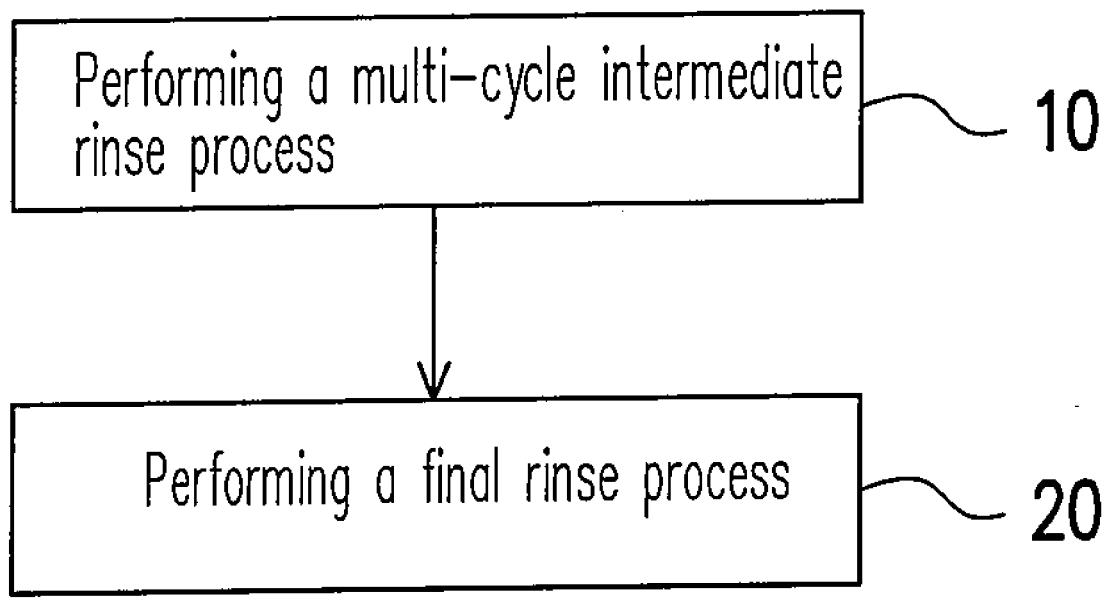
FIG. 1 is a flow chart of steps in exemplary methods that may be used in the removal of particles on a wafer according to an embodiment of the invention.

FIG. 1 is a flow chart of steps in exemplary methods that may be used in the removal of particles on a wafer according to an embodiment of the invention.

Figure 2:
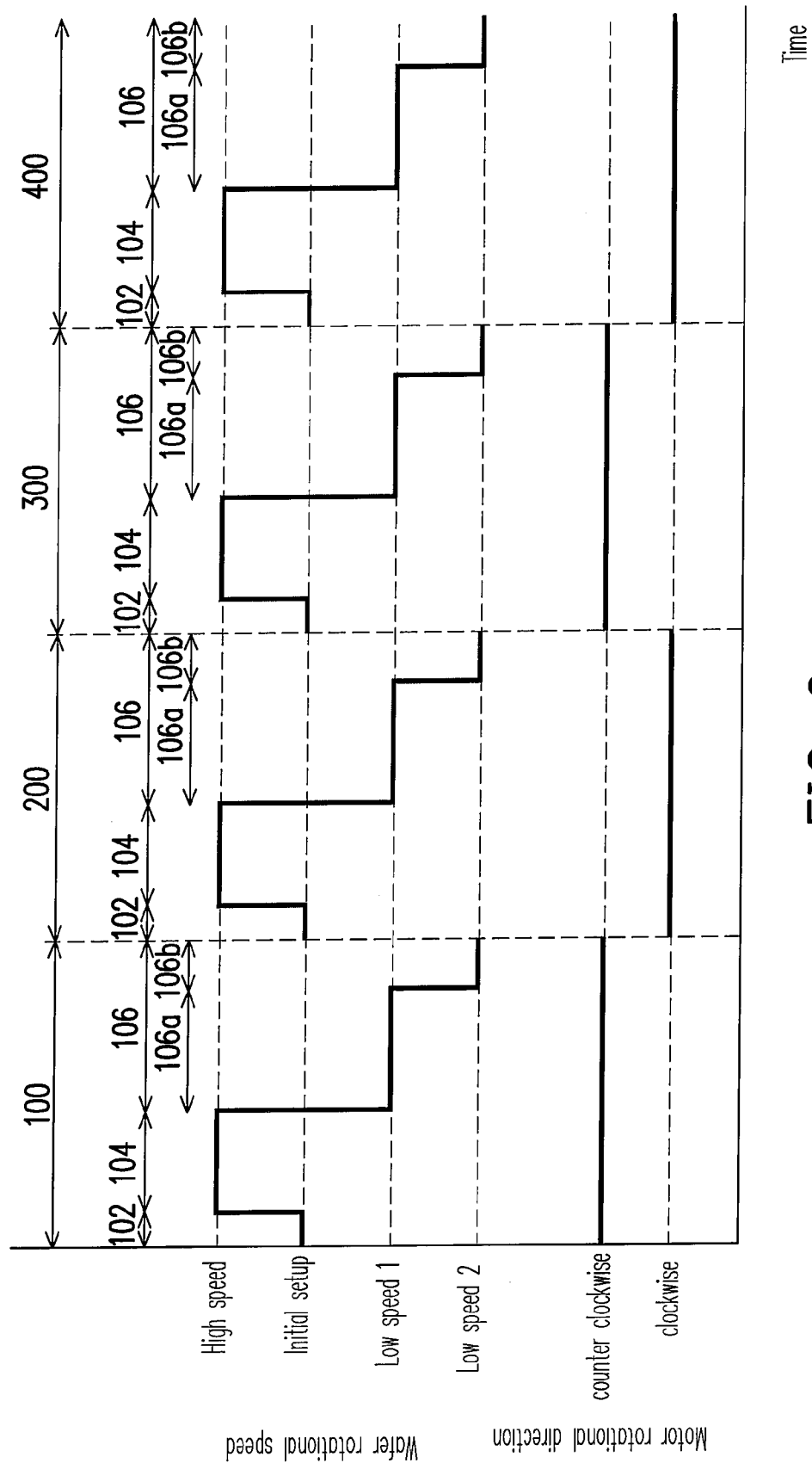
FIG. 2 is a diagram showing the wafer rotational speed and motor rotational direction as a function of time for an exemplary multi-cycle intermediate rinse process of an embodiment of the invention.

FIG. 2 is a diagram showing the wafer rotational speed and motor rotational direction as a function of time for an exemplary multi-cycle intermediate rinse process of an embodiment of the invention.

Referring to FIG. 1, the method in removing particles on a wafer according to an embodiment of the invention includes performing a multi-cycle intermediate rinse process 10, followed by performing a final rinse process 20. The multi-cycle intermediate rinse process 10 and the final rise process 20 may perform at a wet station by a batch or single wafer spin method.

Referring to both FIGS. 1 and 2, the number of cycles in the multi-cycle intermediate rinse process 10 depends on the actual demands and requirements, which may vary from two cycles to 10 cycles. In this embodiment, 4 cycles of the intermediate rinse process 100, 200, 300, 400 are used to illustrate the features of the invention. It should be appreciated that the number of cycles of the intermediate rinse process is not limited to four. Each cycle of the intermediate rinse process 100, 200, 300, 400 includes performing a period of a high-speed wafer-rotation procedure 104, followed by performing a period of a low-speed wafer-rotation procedure 106. The high-speed wafer-rotation procedure 104 provides the mechanical power to remove the particles, while the low-speed wafer-rotation procedure 106 provides the chemical potential force to separate the particles from the wafer.

The high-speed wafer-rotation procedure 104 is performed at a rotational speed of about 100 to 300 rpm for about 5 to about 30 seconds. The low-speed wafer-rotation procedure is performed at a rotational speed of about 20 to 100 rpm for about 5 to about 30 seconds. The rotational speed of the high-speed wafer-rotation procedure 104 is about 3 to 10 times of the rotational speed of the low-speed wafer-rotation procedure 106 or the difference in the rotational speed between the high-speed wafer-rotation procedure 104 and the low-speed wafer-rotation procedure 106 is about 60 to about 280 rpm. In one embodiment, the low-speed wafer-rotation procedure 106 includes a first low-speed wafer-rotation procedure 106a and a second low-speed wafer-rotation procedure 106b or additional wafer-rotation procedures. The rotational speed of the second low-speed wafer-rotation procedure 106b is lower than the rotational speed of the first low-speed wafer-rotation procedure 106a by about 2 to about 5 times or the rotational speed of the second low-speed wafer-rotation procedure 106b is lower than the rotational speed of the first low-speed wafer-rotation procedure 106a by about 30 to about 80 rpm.

Typically, prior to the period of the high-speed wafer-rotation procedure 104, an initial-setup wafer-rotation procedure 102 is performed in order for the wafer to achieve a certain rotational speed. In one embodiment, the initial-setup wafer-rotation procedure 102 is conducted at a rotational speed of about 120 rpm for about 5 seconds, while the high-speed wafer-rotation procedure 104 is conducted at a rotational speed of about 300 rpm of about 20 seconds, the first low-speed wafer-rotation procedure 106a is conducted at a rotational speed of about 60 rpm for about 15 seconds and the second low-speed wafer-rotation procedure 106b is conducted at a rotational speed of about 20 rpm for about 10 seconds. In one embodiment, the rotational speed increases at a rate of about 20 to 50 rpm, for example, 35 rpm, from the initial-setup wafer-rotation procedure 102 to arrive at the rotational speed of the high-speed wafer-rotation procedure 104, and decreases at a rate of about 20 to about 40 rpm, for example, 30 rpm, from the high-speed wafer-rotation procedure 104 to the rotational speed of low-speed wafer-rotation procedure 106a.

The cleaning time of any cycle 100, 200, 300, 400 of the intermediate rinse process 10 is about 1 to 60 minutes, for example 10 minutes. In one embodiment, any cycle 100, 200, 300, 400 of the intermediate rinse process 100 includes three procedures: a first procedure having a wafer speed at 300 rpm and a duration of about 3 minutes, followed by a second procedure having a wafer speed reduced to 180 rpm and a duration of about 3 minutes, further followed by a third procedure having a wafer speed reduced to 60 rpm for a duration of about 4 minutes.

In this embodiment, the rotational speed and the duration of the same procedure 102, 104, 106 of each intermediate rinse process 100, 200, 300, 400 are the same. However, it is appreciated that the rotational speed and the duration of the same procedure 102, 104, 106 of each intermediate rinse process 100, 200, 300, 400 may be the same or different.

In this embodiment, the rotational directions of the motor for controlling the rotation of the wafer in the wafer-rotation procedures 102, 104, 106 of each cycle of the intermediate rinse process 100, 200, 300, 400, are the same, for example, clockwise or counterclockwise. However, the rotational directions of the motor for controlling the rotation of the wafer of two neighboring cycles of the intermediate rinse process, such as the intermediate rinse process 100 and the intermediate rinse process 200, or the intermediate rinse process 200 and the intermediate rinse 300, are different. For example, the rotational direction of the motor in each wafer-rotation procedure 102, 104, 106 of the intermediate rinse process 100 is clockwise, while the rotational direction of the motor in each wafer-rotation procedure 102, 104, 106 of the intermediate rinse process 200 is counterclockwise, and the rotational direction of the motor in each procedure 102, 104, 106 of the intermediate rinse process 300 is clockwise, while the rotation direction of the motor in each wafer-rotation procedure 102, 104, 106 of the intermediate rinse process 400 is counterclockwise.

When each cycle of the intermediate rinse process is being performed, a flushing solvent that may include a chemical agent or deionized water is provided. In one embodiment, a flushing solvent including a chemical agent is provided to the beginning period of the multi-cycle intermediate rinse process 10, such as the intermediate rinse processes 100 and 200, while a flushing solvent is provided to the including deionized water is provided to the concluding period of the multi-cycle intermediate rinse process 10, such as the intermediate rinse processes 300, 400. In another embodiment, a flushing solvent including deionized water is provided to all cycles of the intermediate rinse process 100, 200, 300, 400. Chemical agent includes but not limited to a mixture of ammonia water and hydrogen peroxide (APM, $NH_4ON:H_2O_2:H_2O$). Deionized water includes cold deionized water or hot deionized water. The temperature of the cold deionized water is, for example, room temperature. The temperature of the hot deionized water is, for example, higher than room temperature, such as 50 to 100 degrees Celsius. The flushing solvent is sprayed from the center or the side bowl of the rinse chamber. In one embodiment, when deionized water is used as the flushing solvent, cold deionized water is sprayed from the center of the chamber and hot deionized water is sprayed from the side bowl to prevent the particles at the side of the chamber from cooling down and condensed. Thereafter, hot deionized water is sprayed from both the center and the side bowl of the chamber to enhance uniformity, yield and efficiency of particle removal.

In one embodiment, during each wafer-rotation procedure 102, 104, 106 of the multi-cycle intermediate rinse process 10 or during one or two selective procedures of the wafer-rotation procedures 102, 104 106 of the multi-cycle intermediate rinse process 10, vibration, for example, ultrasonic vibration, is concurrently performed to improve the yield and efficiency of particle removal.

Subsequent to the performance of the multi-cycle intermediate rinse process 10, a final rinse process 20 may also conduct. In the final rinse process 20, hot deionized water may be used for the final rinse process 20 to enhance the yield and efficiency of particle removal. The temperature of the hot deionize water is about 50 to 100 degrees Celsius.

In the multi-cycle intermediate rinse process of the present invention, the low rotational speed is applied for the flushing solvent to form a thick layer of liquid membrane on the surface of the wafer. In one embodiment, for example, the low rotational speed is about 20 rpm, and the thickness of the liquid membrane is about 100 μm. Hence, the residual particles on the surface of the wafer float to the upper surface of liquid membrane due to surface tension, and the particles are expelled from the surface of the wafer by the high-speed rotation. Moreover, since the rotational speeds of the two neighboring cycles of the intermediate rinse process are different, the removal of residual particles from the surface of the wafer is enhanced.

Additionally, with the application of hot deionized water in the final rinse process, the condensation of particles on the wafer or the sidewall of the rinse chamber is prevented to improve the yield or efficiency of particle removal.

Accordingly, the present invention provides a method of removing particles in which particles remaining on a wafer is effectively removed at low cost to increase the yield.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method for removing particles on a wafer or removing unreacted metal layer on the wafer in a salicide process, the method comprising:
performing at least two cycles of intermediate rinse process on the wafer so as to remove particles on the wafer or remove an unreacted metal layer on the wafer, wherein each cycle of the intermediate rinse process comprises performing sequentially a setup procedure conducted at a first rotational speed of the wafer, a first wafer-rotation procedure conducted at a second rotational speed of the wafer, and a second wafer-rotation procedure conducted at a third rotational speed of the wafer, wherein the second rotational speed of the wafer is greater than the third rotational speed of the wafer, and the first rotational speed of the wafer is between the second and the third rotational speeds of the wafer.

2. The method of claim 1, wherein a rotational direction of the wafer is clockwise or counterclockwise, and the rotational directions of the wafer in two neighboring cycles of the intermediate rinse process are different.

3. The method of claim 1, wherein the rotational speed of the wafer in the first wafer-rotation procedure is between 100 to 300 rpm.

4. The method of claim 1, wherein the rotational speed of the wafer in the second wafer-rotation procedure is between 20 to 100 rpm.

5. The method of claim 1, wherein the first wafer-rotation procedure is performed for about 5 seconds to about 30 seconds.

6. The method of claim 1, the second wafer-rotation procedure is performed for about 5 seconds to about 30 seconds.

7. The method of claim 1, wherein the rotational speed of the wafer in the first wafer-rotation procedure is about 3 to about 10 times the rotational speed in the second wafer-rotation procedure.

8. The method of claim 1, wherein the second wafer-rotation procedure comprises a fourth wafer-rotation procedure and a fifth wafer-rotation procedure.

9. The method of claim 1, wherein a rotational speed of the wafer increases from a speed in the setup procedure at a rate of about 20 to about 50 rpm to arrive at a speed in the first wafer-rotation procedure.

10. The method of claim 1, wherein a rotational speed of the wafer decreases from a speed in the first wafer-rotation procedure at a rate of about 20 to 40 rpm to arrive at a speed in the second wafer-rotation procedure.

11. The method of claim 1, where a flushing solvent comprising deionized water is delivered to at least one cycle of the intermediate rinse process.

12. The method of claim 1, wherein in at least one cycle of the intermediate rinse process, a first deionized water is sprayed from a side bowl of a rinse chamber and a second deionized water is sprayed from a center of the rinse chamber, followed by spraying said first deionized water from the side bowl and the center of the rinse chamber concurrently, wherein the temperature of the first deionized water is higher than that of the second deionized water.

13. The method of claim 1, wherein during each of the cycles of the intermediate rinse process, ultrasonic vibration is concurrently performed.

14. The method of claim 1 further comprising performing a final rinse process.

15. The method of claim 1, wherein the at least two cycles of the intermediate rinse process are performed in a wet station.

16. The method of claim 8, wherein the rotational speed of the wafer in the fourth wafer-rotation procedure is about 2 to 5 times the rotational speed in the fifth wafer-rotation procedure.

17. The method of claim 12, wherein a temperature of the first deionized water is between about 50 degrees to about 100 degrees Celsius.

18. The method of claim 12, wherein a temperature of the second deionized water is room temperature.

19. The method of claim 14, wherein deionized water at a temperature of about 50 to 100 degrees Celsius is delivered to the final rinse process.

20. The method of claim 14, wherein the at least two cycles of the intermediate rinse processes and the final rinse process are perform at a wet station by a batch wafer spin method or a single wafer spin method.

* * * * *